United States Patent
Ribeyron et al.

(10) Patent No.: US 7,364,938 B2
(45) Date of Patent: Apr. 29, 2008

(54) METHOD FOR PRODUCTION OF A SEMICONDUCTOR DEVICE WITH AUTO-ALIGNED METALLISATIONS

(75) Inventors: Pierre-Jean Ribeyron, Saint Ismier (FR); Marc Pirot, Niribel Lanchatre (FR)

(73) Assignee: Commissariat a l'Energie Atomique, Paris (FR)

( * ) Notice: Subject to any disclaimer, the term of this patent is extended or adjusted under 35 U.S.C. 154(b) by 326 days.

(21) Appl. No.: 10/555,072

(22) PCT Filed: Apr. 27, 2004

(86) PCT No.: PCT/FR2004/050173

§ 371 (c)(1),
(2), (4) Date: Oct. 28, 2005

(87) PCT Pub. No.: WO2004/097945

PCT Pub. Date: Nov. 11, 2004

(65) Prior Publication Data

US 2006/0275936 A1    Dec. 7, 2006

(30) Foreign Application Priority Data

Apr. 29, 2003   (FR) .................................. 03 50136

(51) Int. Cl.
*H01L 21/00* (2006.01)
(52) U.S. Cl. ............................. 438/98; 438/57; 438/83; 257/E31.003
(58) Field of Classification Search .................. 438/57, 438/83, 98, 100; 257/41, 461; 136/256
See application file for complete search history.

(56) References Cited

U.S. PATENT DOCUMENTS

| | | |
|---|---|---|
| 4,927,770 A | 5/1990 | Swanson |
| 6,396,046 B1 | 5/2002 | Possin et al. |
| 6,423,568 B1 * | 7/2002 | Verlinden et al. .............. 438/98 |

OTHER PUBLICATIONS

Swanson et al., "Point-Contact Silicon Solar Cells", Transactions on Electron Devices, vol. ED-31, No. 5, May 1984, 1984, pp. 661-664.
C. L. Tilford et al., "Development of a 10 kw Reflective Dish PV System", IEEE, 1993, pp. 1222-1227.
P. Verlinden et al., "Multilevel Metallization for Large Area Point-Contact Solar Cells", Proceedings of the International Photovoltaic Energy Conference, May 9-13, 1988, pp. 1466-1471.
French Preliminary Search Report for Application No. 0350136000, dated Jan. 26, 2004.

* cited by examiner

*Primary Examiner*—Michael Lebentritt
*Assistant Examiner*—Reema Patel
(74) *Attorney, Agent, or Firm*—Thelen Reid Brown Raysman & Steiner LLP

(57) ABSTRACT

This invention relates to a process for making a semiconductor device comprising the following steps:
  a doped region with a first type of conductivity is made on a first principal face of a semiconductor substrate and at least one window is made,
  a first metallisation area is deposited on the doped region,
  a dielectric layer is deposited on at least the window and the first metallisation area,
  at least a first opening is etched in the dielectric layer at the window to accommodate a doped region with a second type of conductivity while arranging an undoped portion of the semiconductor substrate laterally between the doped regions,
  the substrate is doped to create the doped region with the second type of conductivity,
  a second metallisation area is deposited.

Application particularly for solar cells in thin layer.

20 Claims, 8 Drawing Sheets

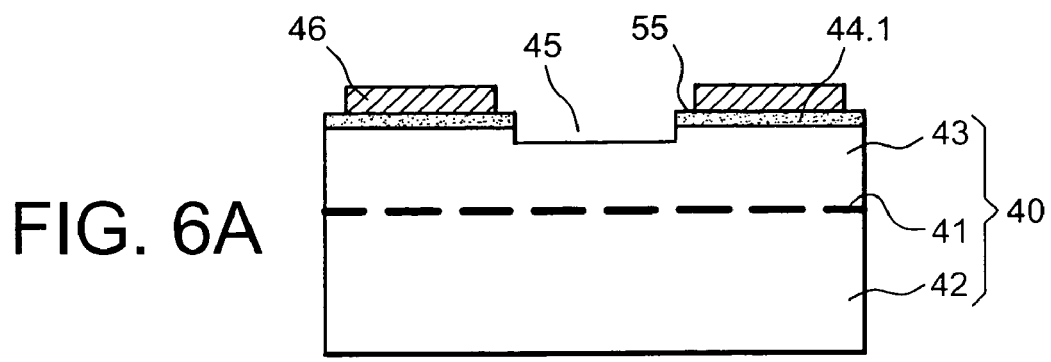
FIG. 6A
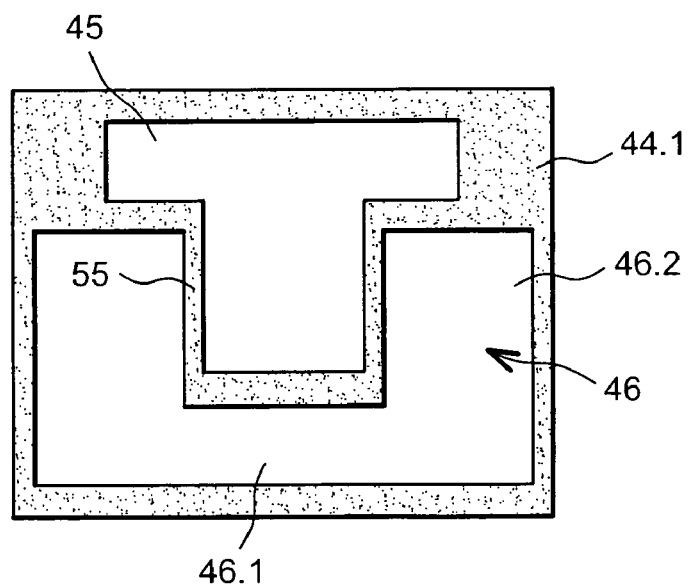
FIG. 6B
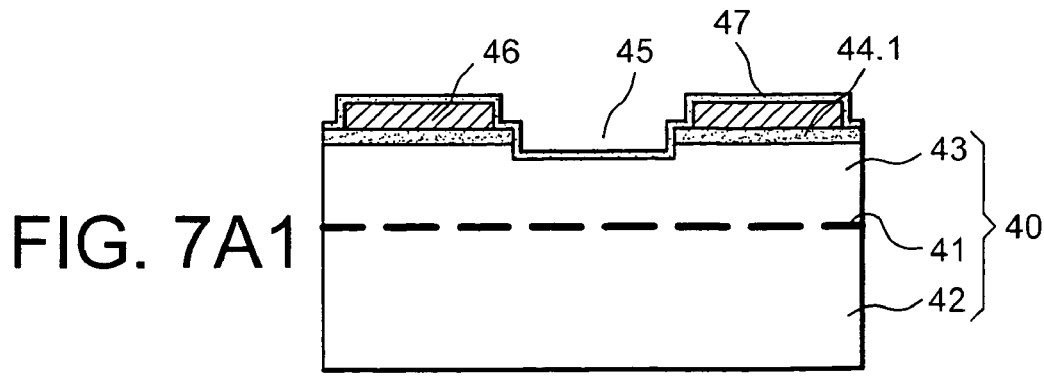
FIG. 7A1

FIG. 7A2

METHOD FOR PRODUCTION OF A SEMICONDUCTOR DEVICE WITH AUTO-ALIGNED METALLISATIONS

This patent application claims the priority of the French patent application filed on Apr. 29, 2003 under number 03 50136, which is incorporated by reference.

CROSS-REFERENCE TO RELATED APPLICATIONS

This application claims priority based on International Patent Application No. PCT/FR2004/050173. entitled "Method for Production of a Semiconductor Device with Auto-Aligned Metallisations" by Pierre-Jean Ribeyron and Marc Pirot. This application also claims the priority of the French application filed on Apr. 29, 2003 under number 03 50136, which is incorporated by reference.

TECHNICAL DOMAIN

This invention relates to a process for making a semiconductor device with self-aligned metallisations placed on a same face of a semiconductor substrate. For example, such a device may be a solar cell with sets of nested comb metallisations, and the process is particularly suitable for the production of solar cells on a thin layer of monocrystalline silicon. Obviously, the process may be applied to other semiconductor devices with nested metallisations, particularly in the form of combs.

STATE OF PRIOR ART

Patent U.S. Pat. No. 6,426,235 contains a description of a process for making solar cells. In this document, the solar cells have two sets of inter-digitised comb metallisations on the back face, and the front face is illuminated. Refer to FIG. 1A that contains an example of a solar cell conforming with the cell described in this document. In this Figure, reference 1 represents a substrate made of a semiconductor material with a first type of conductivity, for example type P, comprising a layer 3 on the surface doped with a second type of conductivity (type $n^+$). Substrate 1, for example made of silicon, will be used as an anode while layer 3 will be used as a cathode. The layer 3 is partially removed at some places to expose the substrate 1. At least one oxide layer 4 is then deposited on the layer 3 and the substrate 1 is exposed and openings are formed in this oxide layer 4 to reach firstly the substrate 1 and secondly the layer 3, so as to be able to delimit semiconductor regions with opposite types of conductivities corresponding to the anode and the cathode, that are to be connected to a first set of comb metallisations 5 for the anode and to a second set of comb metallisations 6 for the cathode. These two sets of comb metallisations 5, 6 are inter-digitised. In the example, the first set of comb metallisations 5 corresponds to the anode of the cell and the second set of comb metallisations 6 corresponds to the cathode of the cell.

The two sets of comb metallisations 5, 6 extend above the dielectric layer 4, but obviously must not come into contact with each other since this would create a short circuit. However, it is very difficult to position the comb metallisation sets 5, 6 correctly relative to each other. These comb metallisations are usually made by screen printing. The distance separating two successive metallisations belonging to different sets must be minimised so that the larger possible area is metallised, since these metallisations also reflect lights because they are placed on the back face of the cell. This distance is typically between about ten or even a hundred micrometers to obtain high performance solar cells. With such distances, the risk of a short circuit between the two sets of comb metallisations is large.

A final step consists of fixing an electrical insulating support above the sets of comb metallisations so as to be able to separate a thin film from the substrate, if a weakened layer was provided in advance in the substrate. Attachment by bonding is not easy because the surface on which the support will be placed comprises a number of items of relief due to the metallisation sets, and the glue thickness is not uniform.

Patent application EP-A-0 776 051 also describes a solar cell with two sets of inter-digitised comb metallisations placed on the back face of the cell. FIG. 1B diagrammatically shows such a solar cell. A first set of comb metallisations 12, for example made of aluminium, is deposited in a semiconductor substrate 10 covered with a surface layer 11 with a first type of conductivity (type $n^+$). The section in FIG. 1B shows only a sequence of the teeth in the comb. An appropriate heat treatment is applied to this set of comb metallisations 12 so that it only diffuses in the substrate through the layer with the first type of conductivity to form a pattern 13 corresponding to a second type of conductivity (type $p^+$), the pattern 13 including teeth spaced from each other by regions 14 of the layer 11 with the first type of conductivity. An oxide layer 15 is deposited on the surface, covering the first set of comb metallisations 12 and the regions 14 of the layer 11 with the first type of conductivity. The oxide layer 15 is removed locally to expose the regions 14. A conducting layer 16 is deposited on the surface. This layer 16 is above the oxide layer 15 on the conducting bands 12 and the regions 14 of the layer 11 with the first type of conductivity. This conducting layer 16 contributes to forming a second set of metallisations that cooperates with the areas 14 with the first type of conductivity. Unlike the structure in FIG. 1A, the two sets of comb metallisations 12, 16 are electrically insulated from each other by the dielectric layer 15. The disadvantage of this type of solar cell is that there are risks of a short circuit between the regions 14 with the first type of conductivity and the pattern 13 with the second type of conductivity because they are adjacent to each other.

PRESENTATION OF THE INVENTION

The purpose of this invention is to propose a process for making a semiconductor device that does not have the disadvantages mentioned above, namely risks of a short circuit between the two sets of metallisations and between regions with opposite types of conductivity, and that is also inexpensive.

A process for making a semiconductor device comprises the following steps:
- a doped region with a first type of conductivity is made on a first principal face of a semiconductor substrate, and at least one window is made delimiting said region,
- a first metallisation area is deposited on the doped region with the first type of conductivity,
- a dielectric layer is deposited on at least the window and the first metallisation area,
- at least a first opening is etched in the dielectric layer at the window exposing the substrate, that will accommodate a doped region with a second type of conductivity while arranging an undoped portion of the substrate laterally between the doped region with the second type of conductivity and the doped region with the first type of conductivity, the substrate is doped to create the doped region with the second type of conductivity, a second metallisation area is deposited covering the dielectric layer and coming into contact with the doped region with the second type of conductivity.

Thus, the semiconductor device obtained is inexpensive because no lithography step is used during its implementation, unlike in prior art, these lithography steps being expensive and industrially incompatible with a preferred solar cells application.

The doped region with the first type of conductivity may be made by deposition of a doped layer with the first type of conductivity on the principal face of the substrate and etching the window exposing the substrate in the doped layer with this first type of conductivity.

As a variant, the doped region with the first type of conductivity may be made by the formation of a dielectric layer on the principal face of the substrate, by stripping a part of the dielectric using a stripping paste by screen printing forming a stripped area around the contour of the future doped region with the first type of conductivity, then doping the stripped area and then removing the remaining dielectric to form the window.

In another variant, the doped region with the first type of conductivity may be made by the formation of a dielectric layer on the principal face of the substrate, by stripping a part of the dielectric using a stripping paste by screen printing forming a stripped area around the contour of the future doped region with the first type of conductivity and then doping the stripped area, the remaining dielectric forming the window.

At least one etching may be done by laser, which can result in fine etching.

As a variant, the etching may be etched by screen printing using a paste capable of stripping the dielectric material.

At least one metallisation area is deposited by screen printing.

The doped region with the first type of conductivity and the doped region with the second type of conductivity may be nested in each other.

The first opening is smaller in area than the window, so that the undoped portion of the substrate can be formed.

The first metallization area may be deposited on the doped region with the first conductivity type before or after the window etching step.

It is preferable if the etching of the doped layer with the first type of conductivity attacks the semiconductor substrate to prevent any short circuit between the doped regions. The deposition step for a second metallisation area may precede the substrate doping step in which the doped region with the second type of conductivity is created, the material in the second metallisation area being annealed so as to diffuse into the substrate at the first opening.

The substrate may be formed from a stack with a weakened layer and a thin layer, the weakened layer being in depth, the principal face of the substrate on which the doped layer with the first type of conductivity is deposited being a face of the thin layer.

The process may comprise a step to fix the second metallisation area onto an electrically insulating support.

This step may be followed by a step to dissociate the thin layer from the substrate at the weakened layer.

The process may include a step for protection of the thin layer on the side on which it was dissociated.

The step to etch the first opening may include etching of a second opening at the first metallisation area exposing a metallisation strip within the first metallisation area.

The deposition step for the second metallisation area does not cover the second opening.

The device may be formed from one or several solar cells. The solar cells may be connected in series and/or in parallel.

BRIEF DESCRIPTION OF THE DRAWINGS

This invention will be better understood after reading the description of example embodiments that is given purely for information and is in no way limitative, with reference to the attached drawings in which:

FIGS. 3, 4A, 4B, 4C, 4D, 4E, 5A, 5B, 6A, 6B, 7A1, 7A2, 7B, 8A, 8B, 9A, 9B, 10 illustrate different steps in the processes according to the invention for making a semiconductor device according to the invention.

Identical, similar or equivalent parts in the different Figures described below are marked with the same numeric references so as to facilitate changing from one Figure to the next.

The different parts shown in the Figures are not necessarily shown at the same scale, to make the Figures more easily readable.

DETAILED PRESENTATION OF PARTICULAR EMBODIMENTS

Figure 2A:
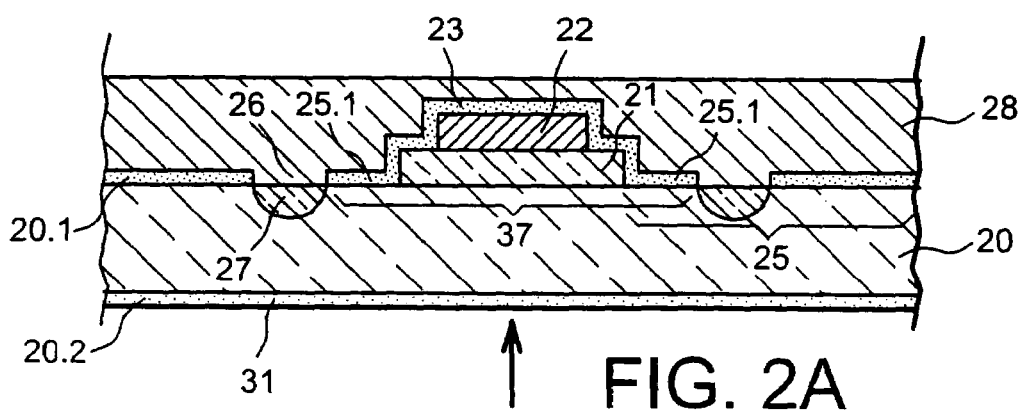
FIG. 2A shows a sectional view of a device obtained by the process according to the invention and FIG. 2B shows a module of solar cells obtained using the process according to the invention.

We will now refer to FIG. 2A that shows a sectional view of a semiconductor device obtained using a process according to the invention. This example shows a solar cell, but it could be any other semiconductor device. This solar cell comprises a semiconductor substrate 20 that is assumed to be thick in this example. This semiconductor substrate 20 may for example be made of silicon. The semiconductor substrate in one variant that will be described in the following with reference to FIGS. 3 to 10 is thin.

The semiconductor substrate 20 comprises a doped region 21 with a first type of conductivity, at a first principal face 20.1 that in this example is on the back face of the solar cell. It is assumed that this doped region 21 is of the n+ type.

This doped region 21 with the first type of conductivity is connected to a first metallisation area 22, this first metallisation area 22 is the closest to the semiconductor substrate. In this example, the first metallisation area 22 is digitiform with a single finger terminating in a metallisation strip 29. The metallisation strip 29 is only visible in FIG. 2B, which should also be referred to and that represents a solar cells module conform with that shown in FIG. 2A.

The first metallisation area 22 could be provided with several fingers connected together by a metallisation strip and thus be in the form of a comb as will be seen later.

The first metallisation area 22 only partially covers the doped region 21 with the first type of conductivity, and a part 24 is not covered. A dielectric layer 23 covers the first metallisation area 22, the part 24 and the region 25 of the substrate 20 located on each side of the doped region 21 with the first type of conductivity. The dielectric layer 23 has first thin openings 26 on each side of the doped region 21 with the first type of conductivity. These openings 26 approximately delimit a doped region 27 with a second type of conductivity opposite to the first type (for example of the p+ first type). This doped region 27 with the second type of conductivity is not contiguous with the doped region 21 with the first type of conductivity. This means that there is laterally an undoped portion 25.1 of the substrate 20 covered by the dielectric layer 23, between the two doped regions with opposite types of conductivity. This undoped portion 25.1 acts as a barrier between the two doped regions 21, 27 with opposite types of conductivity.

This was not the case in the European patent application mentioned above in which a doped region with the first type of conductivity and a doped region with the second type of conductivity were always laterally contiguous, in other words touching each other.

Figure 2B:
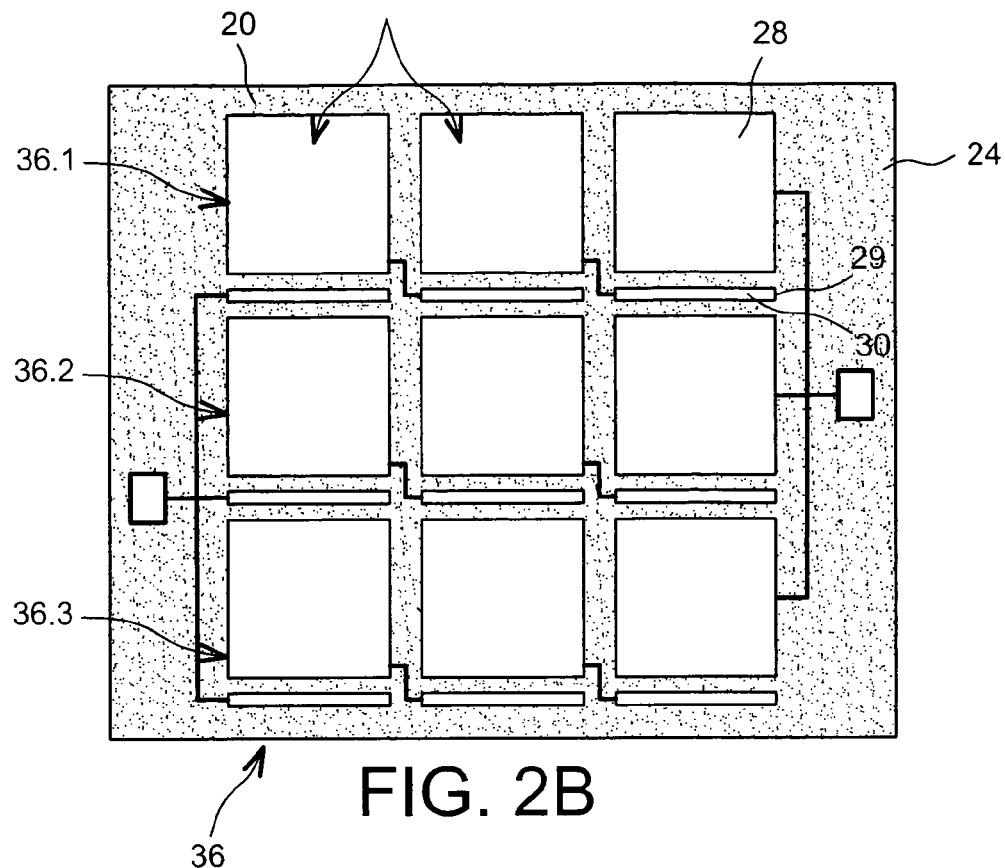

The dielectric layer 23 also comprises a second opening 30 that fully or partially exposes the metallisation strip 29 of the first metallisation area 22, as shown in FIG. 2B.

The dielectric layer 23 and the first openings 26 except for the second opening 30, are covered by an electrically conducting layer 28 that forms a second metallisation area 28 connected to the doped region 27 with the second type of conductivity, at the first openings 26. This second metallisation area 28 has metallisations with a spacing between them and forms an ohmic contact with the doped region 27. The second metallisation area 28 is the furthest from the semiconductor substrate 20. Thus, in the semiconductor device according to the invention, the risk of a short circuit between a doped region 21 with the first type of conductivity and a doped region 27 with the second type of conductivity is eliminated, even if the location of the connection between a doped region with one type of conductivity with its metallisation area, and the location of the connection area between the other doped region with its metallisation area are very close to each other.

The first metallisation area 22 and the second metallisation area 28 are stacked and separated by the dielectric 23, and are thus easily self-aligned. Thus, there is no risk of a short circuit between the first and the second metallisation areas.

The dielectric 23 and the metallisation area 22 furthest from the substrate 20 in the stack, allow a part of the metallisation area 27 furthest from the substrate to be exposed.

The electrically conducting layer 28 will advantageously have an approximately plane free face and also fills in differences in relief, particularly due to the stack in the doped region 21 with the first type of conductivity, the first metallisation area 22, and the dielectric layer 23 on the substrate 20. This planeness is also useful for encapsulating solid substrates in a module. In the case of a solar cell, the second principal face 20.2 of the semiconductor substrate 20 may be covered with a layer 31 of a protective electrical insulation, for example made of silicon nitride, this layer 31 being transparent for received illumination since it is located on the front face of the solar cell. The arrow materialises the illumination received by the solar cell. This layer 31 also performs a function of surface passivation of the substrate 20 and the anti-reflective layer to enable a maximum quantity of light penetrating into the substrate.

In FIG. 2B, it can be seen that the second metallisation area 28 shows the metallisation strip 29 exposed by the second opening 30.

Thus, several of these solar cells 35 may be grouped by manufacturing by batches in a serial and/or parallel set-up on the same substrate 20 in a module 36. This module 36 comprises nine cells 35 mounted in three groups 36.1, 36.2, 36.3 of three cells arranged in series in rows, the three groups in series 36.1, 36.2, 36.3 being mounted in parallel.

We have just described the configuration in which the doped region 27 with the second type of conductivity extends on each side of the doped region 21 with the first type of conductivity. It will possible to envisage the inverse as will be demonstrated in the following. More generally, the doped region with the first type of conductivity and the doped region with the second type of conductivity may be nested in each other, while remaining separated from each other laterally by the undoped portion 25.1 of the substrate. The metallisations of the second metallisation area 28 define at least one space 37 (into which the doped region with the first type of conductivity extends), and the connection between the first metallisation area 22 and the doped region 21 with which it cooperates takes place in the space 37.

We will now consider the process for the production of a semiconductor device conform with the invention. It is assumed that the semiconductor device thus made is a solar cell made in a thin layer of monocrystalline silicon. Refer to FIGS. 3 to 10.

The starting point is a semiconductor substrate 40, for example based on monocrystalline silicon with a weakened layer 41 at a given depth so that the thin layer 43 on one side of the weakened layer 41 can be detached from the rest of the substrate 40 later. For example, this weakened layer 41 may be formed on the surface of a base substrate 42 made of a solid monocrystalline silicon, by an anodisation treatment, or by ionic implantation of gaseous species for example such as hydrogen in the base substrate 42, or by any other weakening process.

Figure 3:
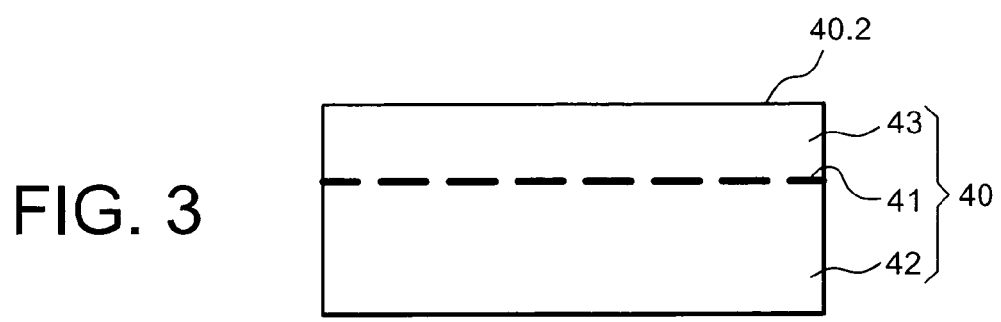

The thin layer 43 located above the weakened layer 41 may be fully or partly formed by epitaxy. Epitaxial growth of silicon is done on the surface to obtain a thickness of a few tens of micrometers above the weakened layer 41 (FIG. 3). For example, an epitaxy in the gaseous phase or in liquid phase may be used.

However, there is no need for epitaxy to make the thin layer 43 if the ionic implantation is sufficiently deep.

We will then make a doped region 44.1 with a first type of conductivity, for example n+. We will then deposit a first metallisation area 46 on the doped region 44.1 with the first type of conductivity.

Figure 4A:
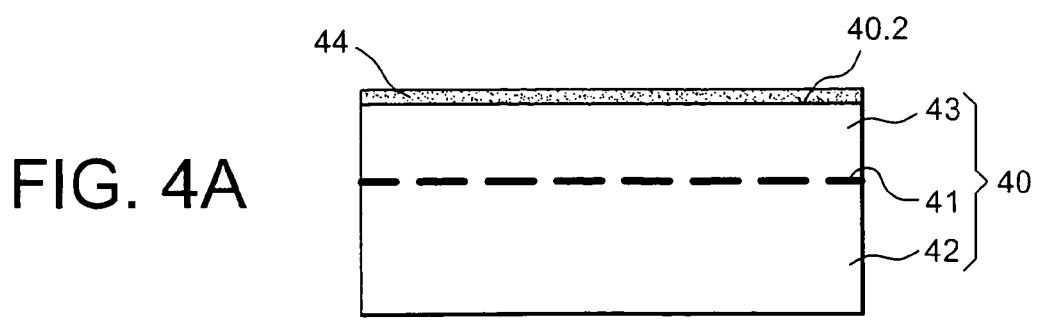
Figure 4B:
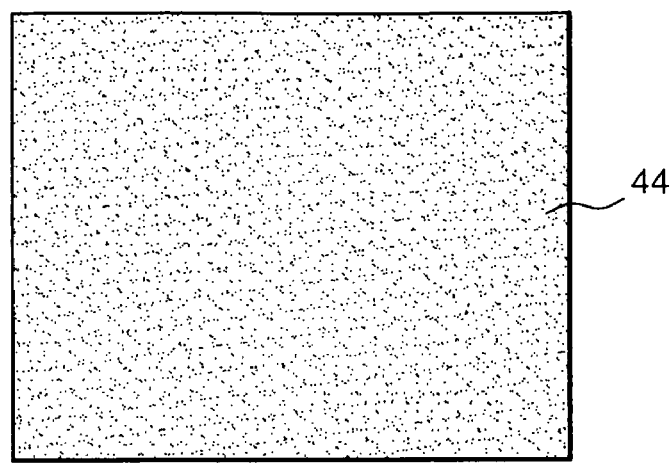
Figure 4C:
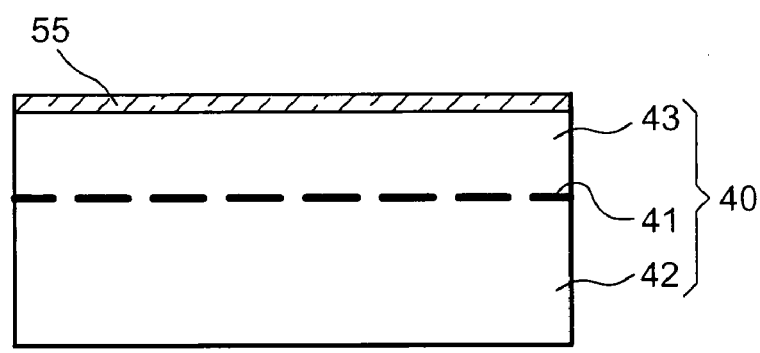

In a first embodiment, a doped layer 44 is made over the entire surface 40.2 of the substrate 40. This doped layer 44 may be made by diffusion of phosphorus atoms or implantation of phosphorus ions in the substrate 40 (actually in the thin layer 43 of the substrate 40) or by adding an appropriate doping agent (for example phosphine $PH_3$) at the end of the epitaxial growth of the epitaxied layer forming the thin layer. This doped layer 44 is shown in FIGS. 4A, 4B.

We will then delimit the doped layer 44 to obtain the doped region 44.1 with the first type of conductivity. This is done by making at least one window 45 in the doped layer 44 so as to expose the substrate 40 located below it. In the following, we have used the term substrate but it is actually the thin layer of the substrate if there is a thin layer. The window 45 is visible in FIGS. 5A, 5B.

This step may be done by laser etching. Laser etching is a fast and precise method, which is advantageous. This lowers the manufacturing cost of the device according to the invention. The pattern of the window 45 is such that it will help to delimit the doped region 44.1 with the first type of conductivity and to house the future doped region with the second type of conductivity, including laterally the undoped portion 40.1 of the substrate 40 separating the doped region 44.1 with the first type of conductivity and the future doped region with the second type of conductivity. In the example described, the window 45 is a T-shape but this is only an example and is in no way limitative, the window 45 could obviously comprise several fingers instead of only one.

Preferably, the etched thickness to make the window 45 is greater than the thickness of the doped layer 44. The etching attacks the substrate 40. The reason is that this further reduces the risk of a short circuit between the doped region 44.1 with the first type of conductivity and the future doped region with the second type of conductivity.

Figure 4D:
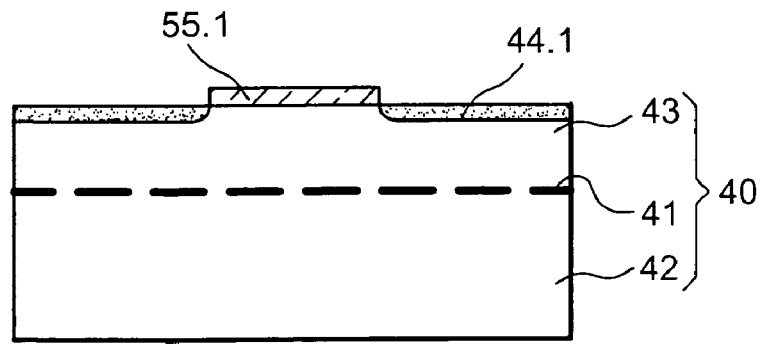
Figure 4E:
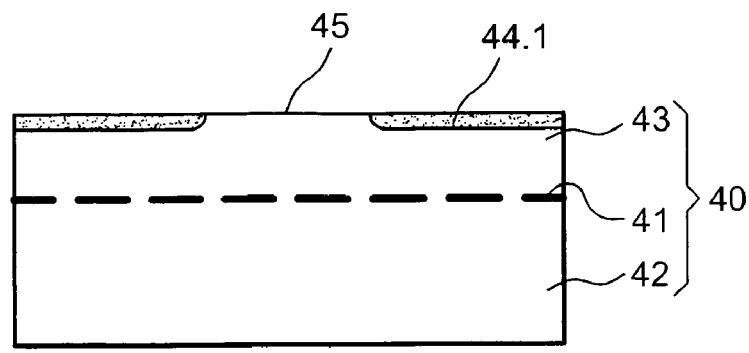
Figure 5A:
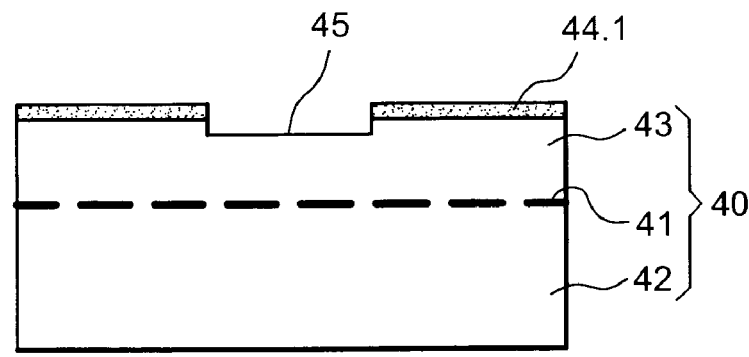
Figure 5B:
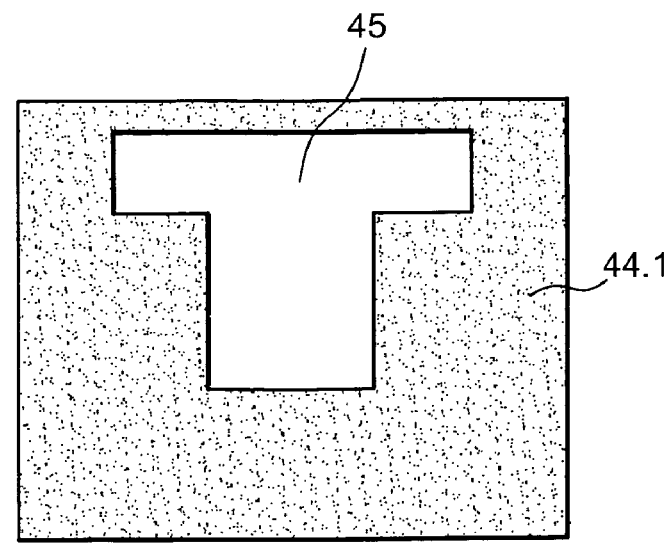

In another embodiment, the doped region 44.1 with the first type of conductivity is made by screen printing. A dielectric layer 55, for example made of silicon oxide or nitride (FIG. 4C), is formed on the substrate 40. A layer made of silicon oxide could also made by thermal oxidation. An area is stripped in this dielectric 55, the contour of which corresponds to the contour of the future doped region with the first type of conductivity. This stripping is done using a stripping paste through a printing screen (not shown). Screen printing techniques are known in microelectronics. The stripping paste is adapted to the nature of the dielectric 55 to be removed. Doping may be done as described above, for example by diffusion of phosphorus atoms in the stripped area, or by implantation of phosphorus ions (FIG. 4D). The remaining dielectric 55.1 protects the substrate from doping. The next step is to remove the remaining dielectric, for example by selective etching, so as to form a window 45 that delimits the doped region 44.1 with the first type of conductivity (FIG. 4E). This window allows the undoped substrate 40 to be exposed. Chemical etching does not attack the substrate.

As a variant, the dielectric that remains after the stripping step can be conserved (FIG. 4D). This dielectric forms the window reference 55.1, and it delimits the doped region 44.1 with the first type of conductivity.

A first metallisation area 46 is connected to the doped region 44.1 with the first type of conductivity. This first metallisation area 46 (or anodic metallisation) is made in a metallisation step, for example by screen printing or printing by a metal jet. Metallisation may also be based on a noble metal such as silver or gold. The first metallisation area 46 comprises metallisations 46.2 spaced from each other, and for example possibly in the form of fingers 46.2. These fingers 46.2 are connected at one end like a comb so as to include a metallisation strip 36.1. In the example described, this metallisation step takes place after the etching step of the window 45. The first metallisation area 46 can be seen in FIGS. 6A, 6B. These Figures are based on the configuration obtained with the first embodiment of the doped region with the first type of conductivity. It can easily be understood that the procedure would be similar with configurations in which the doped region was obtained after a screen printing step, and this is why this procedure is not illustrated.

Obviously, this metallisation step could take place after the step to open the window 45. The first metallisation area 46 may only partially cover the doped region 44.1 with the first type of conductivity as shown in FIGS. 6A, 6B, or on the contrary it may cover it entirely.

Figure 1A:
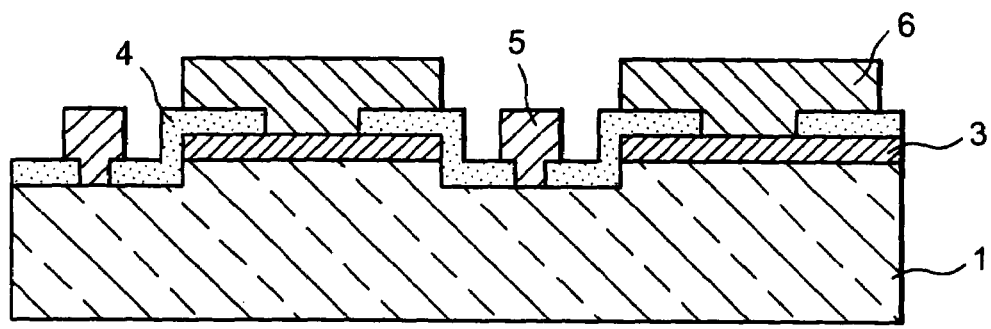
FIGS. 1A, 1B (already described) show sectional views of solar cells according to prior art.
Figure 1B:
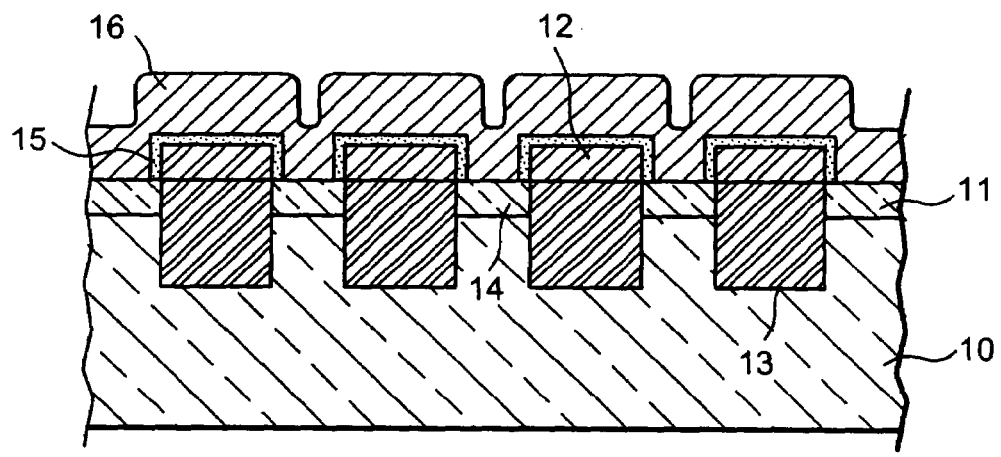
Figure 7B:
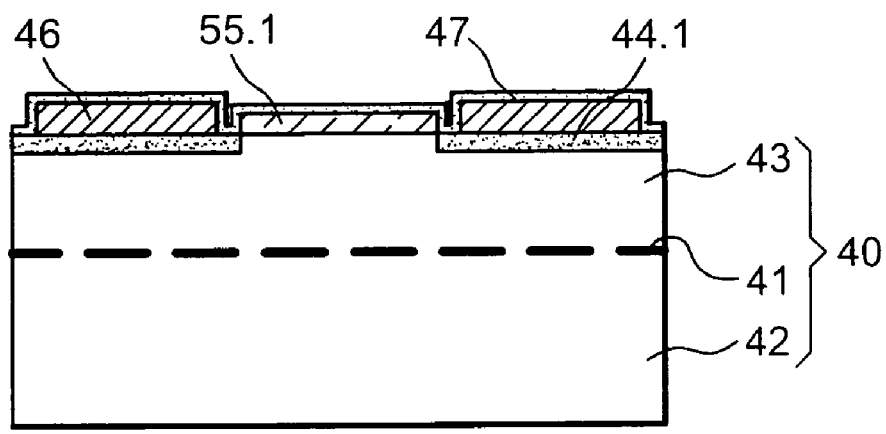
Figure 7B:
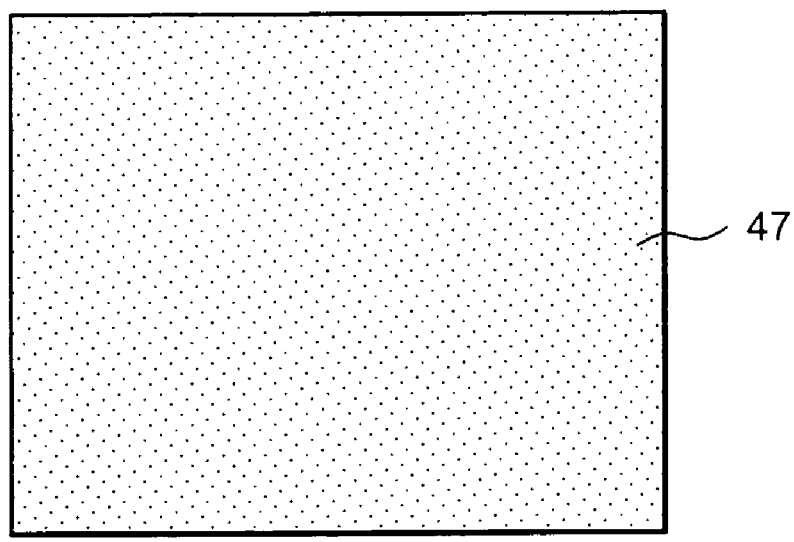

The next step is a step for deposition of a dielectric layer 47 on the structure obtained, and it directly covers the first metallisation area 46, and possibly the doped region 44.1 with the first type of conductivity and the substrate 40 exposed by the window 45. The dielectric layer 47 is visible in FIGS. 7A1, 7A2, 7B. FIG. 7A1 is based on the configuration in which the doped region with the first type of conductivity was obtained by the first embodiment. FIG. 7A2 is based on the configuration in which the doped region with the first type of conductivity was obtained by screen printing, the window 55.1 that contributes to delimiting this region being made of a dielectric material. FIG. 7B is applicable to both cases.

The dielectric layer 47 will insulate the first metallisation area 46 from the future second metallisation area to be made later. For example, the dielectric material may be a silicon oxide or a silicon nitride. It may for example be deposited by a Plasma Enhanced Chemical Vapour Deposition (PECVD) technique, or any other appropriate technique.

Figure 8A:
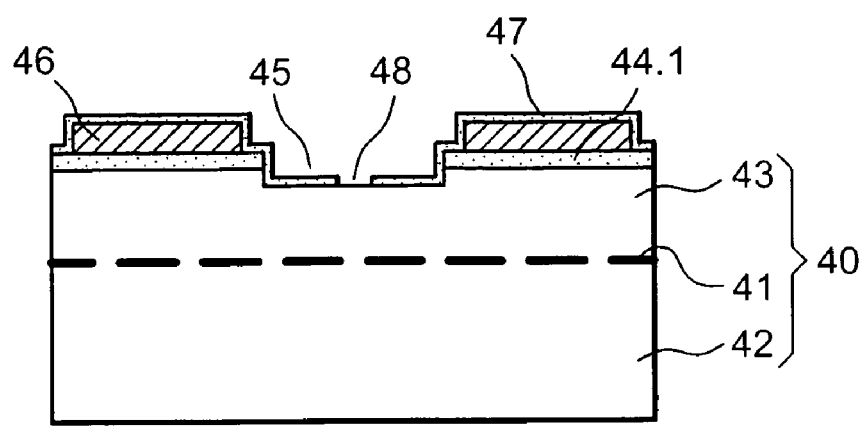
Figure 8B:
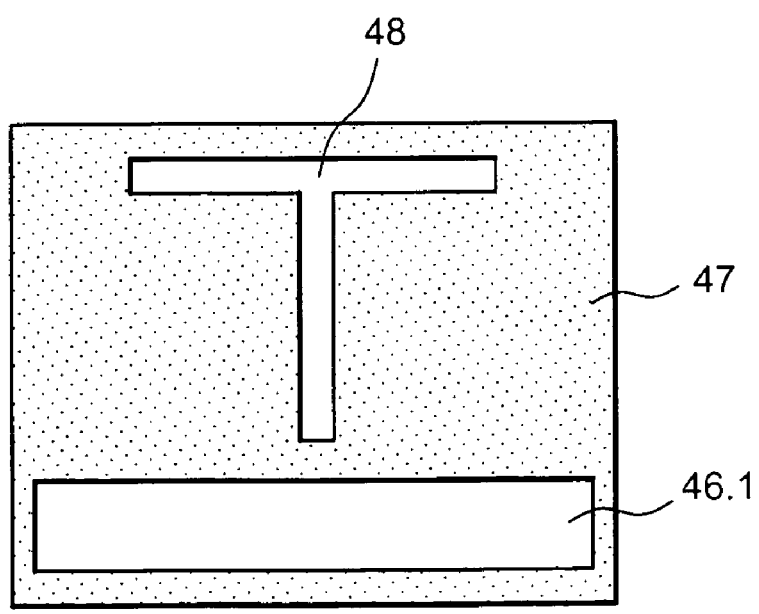

The next step etches the dielectric layer 47 to expose the substrate 40 at the window 45 (or 55.1). In this step, a first opening 48 is made with a smaller area than the opening of window 45 (FIGS. 8A, 8B). These Figures apply to the first embodiment of the doped region with the first type of conductivity. The contour around this first opening 48 corresponds to the required contour for the future doped region with the second type of conductivity that will be made later. The undoped portion 40.1 of the substrate 40 that acts laterally as a barrier between the doped region 44.1 with the first type of conductivity and the future doped region with the second type of conductivity, is located around this opening. This undoped portion 40.1 of the substrate 40 may have a width of about 10 micrometers. This etching step is advantageously done by laser when the first opening 48 is very thin. Opening widths of the order of a few tens of micrometers can easily be achieved. Other etching methods can be used, if they are compatible with the required fineness of the opening. In particular, note screen printing using a stripping paste appropriate to the nature of the dielectric 47.

The etching step can also be used to make a second opening 49 in the dielectric layer 47 at the first metallisation area 46 to expose the metallisation strip 46.1 (FIGS. 8A, 8B). This exposure may be partial or total.

The next step is to make the doped area 50 with the second type of conductivity and the second metallisation area 51 to be connected to it. These two elements can be made at the same time by depositing a metallic deposit 51, for example based on aluminium or an aluminium silver alloy above the dielectric layer 47, in the first opening 48 but not in the second opening 49 (if there is one), by screen printing or by printing with a metallic jet. This deposition is followed by thermal annealing at temperatures of the order of 400° C. to 800° C. This thermal annealing enables metallic atoms to diffuse into the substrate 40, this diffusion leading to doping the part exposed by the first opening 48 with the second type of conductivity. This formed the doped area 50 with the second type of conductivity. In this example, the result is a p+ type doping. This doped area 50 is also called the back surface field.

Figure 9A:
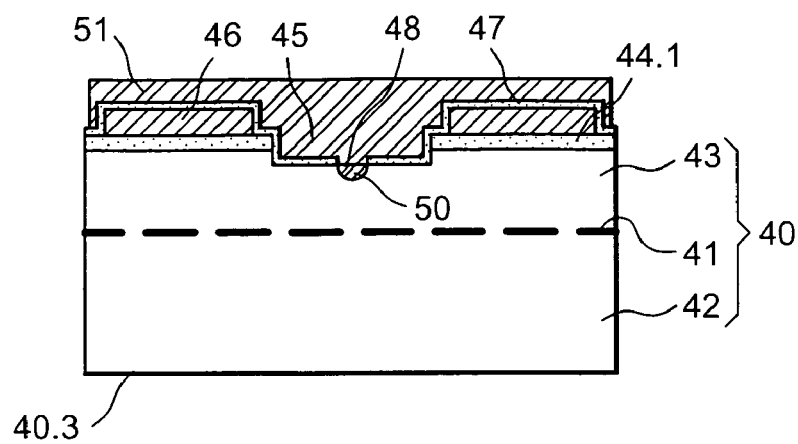
Figure 9B:
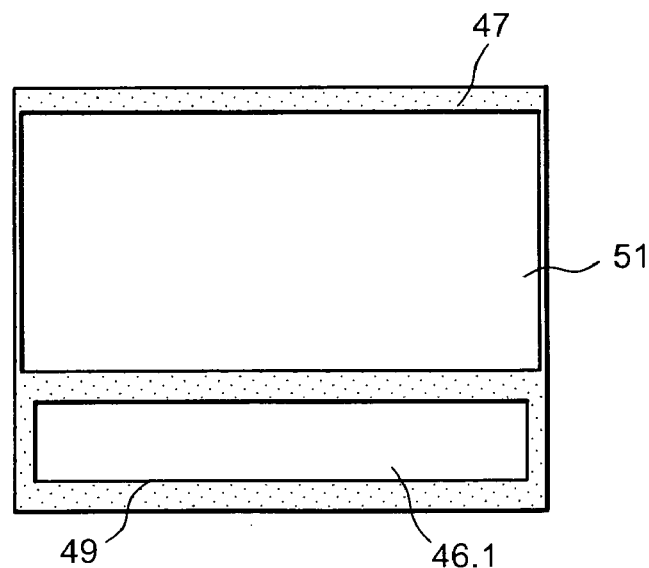

The metallic layer 51 forms the second metallisation area 51 (or cathode metallisation) that cooperates with the doped region 50 with the second type of conductivity (FIGS. 9A, 9B). FIG. 9B illustrates the metallic deposit realized on the deice of FIGS. 8A, 8B. Thus, the second metallisation area 51 is self-aligned with the first metallisation area 46, but without the need to use a complex lithography mask. The second metallisation area 51 is perfectly insulated electrically from the first metallisation area 46 by the dielectric layer 47.

Instead of making the doped region 50 with the second type of conductivity using the same material as the second metallisation area as a doping agent, the substrate 40 can be doped with an appropriate material at the first opening 48 in a first step by ionic diffusion or implantation. In the example, this material that could be boron, leads to a p+ type doping.

Metallisation leading to the second metallisation area 51 will be done later.

The metallisation area 46 closest to the substrate may be configured as a comb with the fingers 46.2 and a metallisation strip 46.1 connecting the fingers, the dielectric 47 and the metallisation area 51 furthest from the substrate, at least partially exposing the metallisation strip 46.1.

All steps that have just been described may be used to make a semiconductor device similar to that described in FIGS. 2A, 2B on a thick substrate. Thus, in the two examples presented, at least one of the metallisation areas comprises contacts separated by at least one space (reference 55 in FIGS. 6A, 6B). These contacts are located in the doped region with which the metallisation area cooperates. The other metallisation area cooperates with the corresponding doped region in the space 55.

Figure 10:
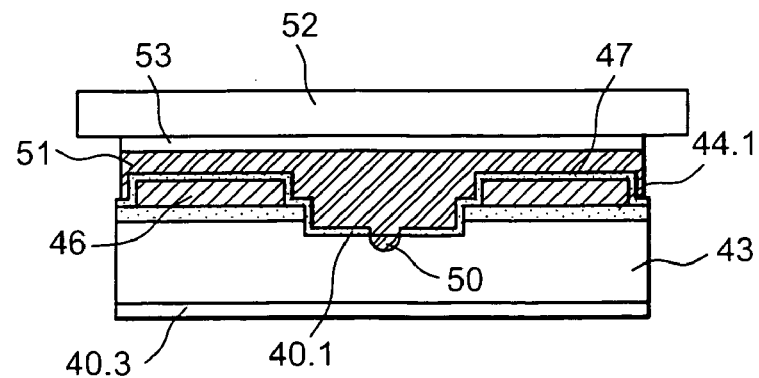

The next step is to add, for example by gluing, a low cost electrically insulating support 52 for example made of glass, plastic material resisting relatively high temperatures (for example of the order of 350° C.) so that it is compatible with the later technological steps, or ceramic or another material, on the second metallisation area 51 furthest from the substrate (FIG. 10). The glue is referenced 53. The glue 53 may easily be distributed by full plate screen printing. The thickness of the glue 53 is approximately constant if the exposed area of the second metallisation area 51 is approximately plane. Gluing is much easier than if it has to be done on a face with relief, as is the case in American patent U.S. Pat. No. 6,426,235 mentioned at the beginning. In this case, areas between metallisations had to be carefully filled with glue.

The thin layer 43 of the base substrate 42 can then be separated at the weakened layer 41 (FIG. 10) by means of a heat treatment and/or for example the application of mechanical forces.

A protection layer 54 can be provided on the face of the thin layer 43 at the separation (FIG. 10). For example, a dielectric layer could be deposited for example silicon oxide or silicon nitride, for example deposited at 350° C. This layer that acts as an anti-reflective, passivation and protection layer, must be transparent to the illumination to which the device will be exposed if the described device is a solar cell.

One advantage of the metallisation forming the second metallisation area 51 is firstly that it covers practically the entire treated face of the substrate 40, and secondly that it reflects light that penetrated into the substrate 40 without being absorbed. It thus provides very good optical confinement and better conversion efficiency than cells without this reflecting element. This advantage is particularly noticeable in cells with a thin substrate (less than about 50 micrometers) of the type consisting of a cell made of a thin layer of monocrystalline silicon since light can pass through the entire thickness without being absorbed.

Another advantage of this metallisation is that it can be done without fine alignment. Thus, mask alignment problems inherent to nested or inter-digitised metallisations can be eliminated. All that is necessary is to not cover the metallisation strip 46.1 of the first metallisation area 46 produced.

Such a process could also be used to make very high efficiency solar cells with lithography steps or low cost solar cells made in an industrial context with screen printing and/or the use of laser etching.

Although several embodiments of this invention have been illustrated and described in detail, it will easily be understood that different changes and modifications can be made without going outside the framework of the invention. In the examples described, the first type of conductivity is of the n+ type and the second is of the p+ type. Obviously, the inverse will be possible, and those skilled in the art would have no problem in choosing appropriate materials to achieve these conductivities. Several semiconductor devices conform with the invention can be made on the substrate at the same time, and individual devices can then be dissociated or electrically connected to make a module conform with the module in FIG. 2B.

The invention claimed is:

1. Process for making a semiconductor device comprising the following steps:
    a doped region (44.1) with a first type of conductivity is made on a first principal face (40.2) of a semiconductor substrate (40), and at least one window (45) is made delimiting said region,
    a first metallisation area (46) is deposited on the doped region (44.1) with the first type of conductivity,
    a dielectric layer (47) is deposited on at least the window (45) and the first metallisation area (46),
    at least a first opening (48) is etched in the dielectric layer (47) at the window (45) exposing the substrate (40) that will accommodate a doped region (50) with a second type of conductivity while arranging an undoped portion (40.1) of the semiconductor substrate laterally between the doped region (50) with the second type of conductivity and the doped region (44.1) with the first type of conductivity,
    the substrate (40) is doped to create the doped region (50) with the second type of conductivity,
    a second metallisation area (50) is deposited covering the dielectric layer (47) and coming into contact with the doped region (50) with the second type of conductivity.

2. Process according to claim 1, characterised in that the doped region (44.1) with the first type of conductivity is made by deposition of a doped layer (44) with the first type of conductivity on the principal face (40.2) of the substrate and etching the window exposing the substrate in the doped layer with this first type of conductivity.

3. Process according to claim 1, characterised in that the doped region (44.1) with the first type of conductivity is made by the formation of a dielectric layer (55) on the principal face (40.2) of the substrate, by stripping a part of the dielectric (55) using a stripping paste by screen printing forming a stripped area around the contour of the future doped region with the first type of conductivity, then doping the stripped area, and then removing the remaining dielectric (55) to form the window.

4. Process according to claim 1, characterised in that the doped region (44.1) with the first type of conductivity is made by the formation of a dielectric layer (55) on the principal face (40.2) of the substrate, by stripping a part of the dielectric (55) using a stripping paste by screen printing forming a stripped area around the contour of the future doped region with the first type of conductivity and then doping the stripped area, the remaining dielectric (55) forming the window (55.1).

5. Process according to claim 1, characterised in that at least one etching is a laser etching.

6. Process according to claim 1, characterised in that at least one of the etchings is a screen printing etching.

7. Process according to claim 1, characterised in that at least one metallisation area is made by screen printing.

8. Process according to claim 1, characterised in that the doped region (44.1) with the first type of conductivity and the doped region (50) with the second type of conductivity are nested in each other.

9. Process according to claim 1, characterised in that the first opening (48) is smaller in area than the window (45).

10. Process according to claim 1, characterised in that the first metallisation area (46) is deposited on the doped region (44.1) with the first type of conductivity before or after the window (45) etching step.

11. Process according to claim 2, characterised in that etching of the doped layer (44) with the first type of conductivity attacks the semiconductor substrate (40).

12. Process according to claim 1, characterised in that deposition step for the second metallisation area (51) precedes the doping step of the substrate (40) in which the doped region (50) with the second type of conductivity is created, the material in the second metallisation area (51) being annealed so as to diffuse into the substrate at the first opening (48).

13. Process according to claim 1, characterised in that the substrate (40) comprises a stack with a weakened layer (41) and a thin layer (43), the weakened layer being in depth, the principal face (40.2) of the substrate on which the doped layer (44) with the first type of conductivity is deposited being a face of the thin layer.

14. Process according to claim 13, characterised in that it comprises a step to fix the second metallisation area (51) onto an electrically insulating support (52).

15. Process according to claim 14, characterised in that it comprises a step to dissociate the thin layer (43) from the substrate at the weakened layer (41).

16. Process according to claim 15, characterised in that it comprises a step for protection and passivation of the thin layer (43) on the side on which it was dissociated.

17. Process according to claim 1, characterised in that the step to etch the first opening (48) includes etching of a second opening (49) at the first metallisation area (46) exposing a metallisation strip (46.1) within the first metallisation area (46).

18. Process according to claim 17, characterised in that the deposition step for the second metallisation area (51) does not cover the second opening (49).

19. Process according to claim 1, characterised in that the device is formed from one or several solar cells (35).

20. Process according to claim 19, characterised in that the solar cells are connected in series and/or in parallel.

* * * * *